(12) United States Patent
Forsberg

(10) Patent No.: US 6,943,630 B2
(45) Date of Patent: Sep. 13, 2005

(54) AMPLIFIER CIRCUIT, AN OPTICAL COMMUNICATION SYSTEM AND A METHOD OF CONTROLLING AMPLIFICATION

(75) Inventor: Gunnar Forsberg, Stockholm (SE)

(73) Assignee: Transmode Systems AB, Hagersten (SE)

( * ) Notice: Subject to any disclaimer, the term of this patent is extended or adjusted under 35 U.S.C. 154(b) by 0 days.

(21) Appl. No.: 10/433,084

(22) PCT Filed: Nov. 29, 2001

(86) PCT No.: PCT/SE01/02648
§ 371 (c)(1),
(2), (4) Date: May 30, 2003

(87) PCT Pub. No.: WO02/45255
PCT Pub. Date: Jun. 6, 2002

(65) Prior Publication Data
US 2004/0036537 A1 Feb. 26, 2004

(30) Foreign Application Priority Data
Dec. 1, 2000 (SE) .............................. 0004434

(51) Int. Cl.⁷ ................................. H03F 3/08
(52) U.S. Cl. .................... 330/308; 250/214 A
(58) Field of Search ............... 330/308, 110, 330/59, 145; 250/214 A

(56) References Cited

U.S. PATENT DOCUMENTS

| | | | | |
|---|---|---|---|---|
| 4,567,446 A | * | 1/1986 | Konishi | ...................... 330/308 |
| 5,606,277 A | * | 2/1997 | Feliz | ........................... 327/311 |
| 5,646,573 A | | 7/1997 | Bayruns et al. | |
| 6,069,534 A | * | 5/2000 | Kobayashi | .................. 330/308 |
| 6,340,916 B1 | * | 1/2002 | Chen et al. | .................... 330/69 |

FOREIGN PATENT DOCUMENTS

| | | | | |
|---|---|---|---|---|
| JP | 2164112 | | 6/1990 | |
| JP | 4-107004 | * | 4/1992 | ................. 330/308 |
| JP | 4-225611 | * | 8/1992 | ................. 330/308 |
| JP | 09093204 | | 4/1997 | |
| JP | 09172330 | | 6/1997 | |
| JP | 09298426 | | 11/1997 | |
| JP | 10284955 | | 10/1998 | |
| WO | 99/28768 | | 6/1999 | |

* cited by examiner

Primary Examiner—Henry Choe
(74) Attorney, Agent, or Firm—Swidler Berlin LLP

(57) ABSTRACT

The invention concerns an amplifier circuit for receiving an optical signal. The circuit comprises a light sensitive member (301) which delivers an electric signal in response to an optical signal. Furthermore, the amplifier circuit comprises an amplifier unit (302) with a first input (304) which receives an electric signal from the light sensitive member (301). The amplifier unit (302) is of the kind which does not have any special input intended for controlling the amplification. A filter unit (310) prevents a possible direct current from the light sensitive member (301) from reaching the first input (304). A control unit (314) is connected to the first input (304) for controlling the amplification of the circuit. The invention also concerns an optical communication system comprising an amplifier circuit of the above-described kind. The invention also concerns a method of controlling the amplification in an optical input stage.

16 Claims, 2 Drawing Sheets

AMPLIFIER CIRCUIT, AN OPTICAL COMMUNICATION SYSTEM AND A METHOD OF CONTROLLING AMPLIFICATION

BACKGROUND OF THE INVENTION AND PRIOR ART

The present invention concerns an amplifier circuit for receiving an optical signal, which amplifier circuit comprises:

a light sensitive member arranged to receive an optical input signal and to deliver an electric signal in response to the received optical signal, and an amplifier unit with a first input arranged to receive the electric signal from the light sensitive member, wherein the amplifier unit is arranged to influence the amplification of the electric signal and to deliver an amplified output signal via a first output, wherein the amplifier unit does not have any further input specially intended for controlling the amplification of the amplifier unit.

The invention also concerns a communication system and a method of controlling the amplification in an optical input stage.

The above described amplifier circuit may suitably be used for amplifying an input signal originating from an optical fibre. The amplifier circuit may thus constitute a fibre optic input stage. Such an input stage is used in optical communication systems. Such an input stage may be followed by further amplifiers. The input stage thus often ensures that an input signal from an optical communication path is adapted to an input of a subsequent amplifier.

FIG. 1 shows schematically an example of such an optical input stage according to the prior art. The input stage comprises a light sensitive member 301. The light sensitive member 301 may for example constitute a photo-diode. The light sensitive member 301 delivers an electric signal in response to an optical input signal, for example from an optical fibre (not shown in the figure). According to the shown example, the cathode of the photo-diode 301 is connected to a bias voltage V1. The circuit comprises an amplifier unit 302, which is often called preamplifier. The amplifier unit 302 has a first input 304 which receives an electric signal from the light sensitive member 301. The amplifier unit 302 influences the amplification of the electric signal and delivers an amplified output signal via a first output 306. The shown photo-diode 301 delivers a current into the input 304, wherein the strength of the current depends on detected light. The amplifier unit 302 converts the current to a voltage at the output 306. The transfer function therefore gets the unit V/A, i.e. ohm. The amplification of the amplifier unit 302 may thus be stated in ohm. The amplifier unit 302 may also comprise an internal amplification control unit 308 which for example may be arranged to reduce the amplification at too high currents.

The English abstract of JP-A-10284955 shows an example of this kind of optical input stage. This document shows such an input stage with a control circuit for controlling the amplification in response to an average value of the optical input power.

Also WO99/28768 shows an optical input stage where a control circuit controls a variable impedance element in the form of a diode connected to an amplifier input.

The English abstract of JP-A-09298426 shows an optical input stage with a preamplifier. In this case the preamplifier has a special input where a control signal may be connected for controlling the amplification of the preamplifier. However, an optical input stage usually lacks a special input for controlling the amplification. An example of an input stage is the one which is sold with the name MC2006 of the fabrication Microcosm. For example this input stage comprises an internal control unit for reducing the amplification at too high currents. However, the input stage lacks a special input for being able to control the amplification.

SUMMARY OF THE INVENTION

A purpose of the present invention is to achieve an amplifier circuit which makes it possible to control the amplification in an optical input stage with an amplifier unit which does not have any special input intended for controlling the amplification. Another purpose is to achieve such an amplifier circuit by relatively simple means.

These purposes are achieved by an amplifier circuit according to the first paragraph above and which is characterised by a filter unit arranged to prevent a possible direct current in the electric signal from the light sensitive member from reaching said first input, and a control unit connected to said first input and arranged to control the power of the electric signal at this first input for thereby influencing the power of said output signal.

The filter unit may for example constitute a capacitor. This filter unit disconnects a possible direct current from the light sensitive member. Instead the control unit is connected to the first input. The power of the input signal at the first input is thus controlled with the help of the control unit instead of with the help of a direct current from the light sensitive member. Thereby, the power of the output signal from the second output may be influenced with the help of the control unit, i.e. the purpose to be able to control the amplification of the amplifier unit is achieved.

According to an embodiment of the invention, said light sensitive member is arranged such that a possible direct current from the light sensitive member would be directed into said amplifier unit via the first input if said filter unit were not arranged to prevent such a direct current, wherein the control unit is arranged to control the power of an electric current in the direction in via the first input. According to this embodiment, a light sensitive member may thus be used where the current into the first input depends on detected light intensity.

According to a further embodiment, the control unit is arranged as a controllable current generator in that a variable amplification controlling voltage unit is connected to a first resistance connected to said first input. This embodiment constitutes an advantageous and simple example of how the current into the first input may be controlled.

According to still an embodiment, said light sensitive member comprises a first diode-unit with a first connection connected to a bias voltage and a second connection connected to said filter unit, which filter unit is connected to the first input. According to this embodiment, for example a photo-diode of the kind which has been described above may thus be used as light sensitive member.

According to still an embodiment, the first connection constitutes the cathode side of the first diode unit and the second connection constitutes the anode side of the first diode unit. A photo-diode usually functions such that its reverse current depends on incident light intensity. According to this embodiment, the current in towards the first input is thus controlled with the help of the diode unit.

According to a further embodiment, the amplifier circuit comprises a second resistance connected to said second connection for conducting away a possible direct current through the first diode unit. Since a direct current from the light sensitive member is prevented from reaching the first input, this current must be conducted away in a suitable manner. A simple construction is to connect the light sensitive member to a resistance which conducts this current away.

According to still an embodiment, the amplifier circuit comprises an amplification limiting unit connected to said first input. Hereby is prevented that the amplifier unit is set at a too high amplification.

According to another embodiment, the amplification limiting unit comprises a third resistance connected between a voltage source and said first input. If the amplifier unit is of the kind where a lower current at the first input means a higher amplification, then suitably with the help of such a third resistance it may be ensured that always a certain current is present at said first input. Thus a limitation of the amplification has been achieved in a simple manner.

According to another embodiment, said amplifier unit comprises an internal amplification controlling unit, for example arranged for reducing the amplification at too high currents. As has been mentioned above, the amplifier unit may also have an internal amplification control.

According to a further embodiment, a second diode unit is connected to said control unit for preventing incorrect current direction to/from the first input. For example if the amplifier circuit is arranged such that always a certain current is input via said first input, then the second diode unit may be arranged for preventing a current in the opposite direction.

According to still an embodiment, the amplifier circuit comprises a filter member connected to said control unit for filtering out possible disturbances in the electric signal which is controlled by the control unit. It is hereby ensured that possible disturbances do not reach the first input.

According to a further embodiment, the amplifier circuit comprises a fourth resistance with a first side connected to said light sensitive member and a second side arranged to be connectable to a measuring unit for measuring the current through the light sensitive member. It may be desirable to be able to measure the photocurrent through the light sensitive member, for example for determining the optical input power. In order to prevent that the measuring unit is connected to a point which is sensitive to disturbances, suitably such a fourth resistance may be arranged.

Another purpose of the invention is to achieve an optical communication system. This purpose is achieved by an optical communication system comprising a first-transmitter-receiver unit, a second transmitter-receiver unit and at least one optical conduction member which connects the first and the second transmitter-receiver units, wherein at least one of said transmitter-receiver units comprises an amplifier circuit according to any of the preceding embodiments. Such an optical communication system has the advantage that the amplification of the input stage may be controlled according to the above-described embodiments.

As has been mentioned above, another purpose of the invention is to offer a method for controlling the amplification in an optical input stage which comprises a light sensitive member arranged to receive an optical input signal and to deliver an electric signal in response to the received optical signal, and an amplifier unit with a first input arranged to receive the electric signal from the light sensitive member, wherein the amplifier unit is arranged to influence the amplification of the electric signal and to deliver an amplified output signal via a first output, wherein the amplifier unit does not have any further input specially intended for controlling the amplification of the amplifier unit.

This purpose is achieved by the following method steps: that a filter unit is arranged to prevent a possible direct current in the electric signal from the light sensitive member from reaching said first input, and that a control unit is connected to said first input and arranged to control the power of the electric signal at this first input for thereby influencing the power of said output signal. This method has the same advantages as have been described above in connection with the amplifier circuit according to the invention.

Advantageous embodiments of the method are clear from the other dependent claims.

BRIEF DESCRIPTION OF THE DRAWINGS

The present invention will now be explained with the help of embodiments and with reference to the annexed drawings.

DESCRIPTION OF EMBODIMENTS OF THE INVENTION

Figure 1:
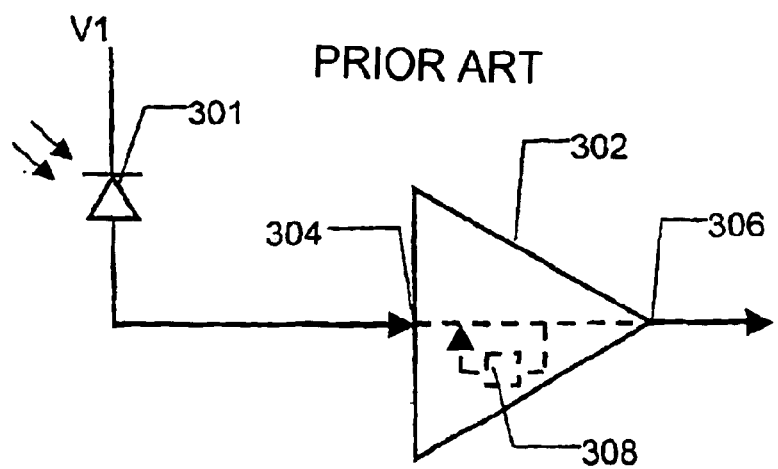
FIG. 1 shows schematically an optical input stage according to the prior art.
Figure 2:
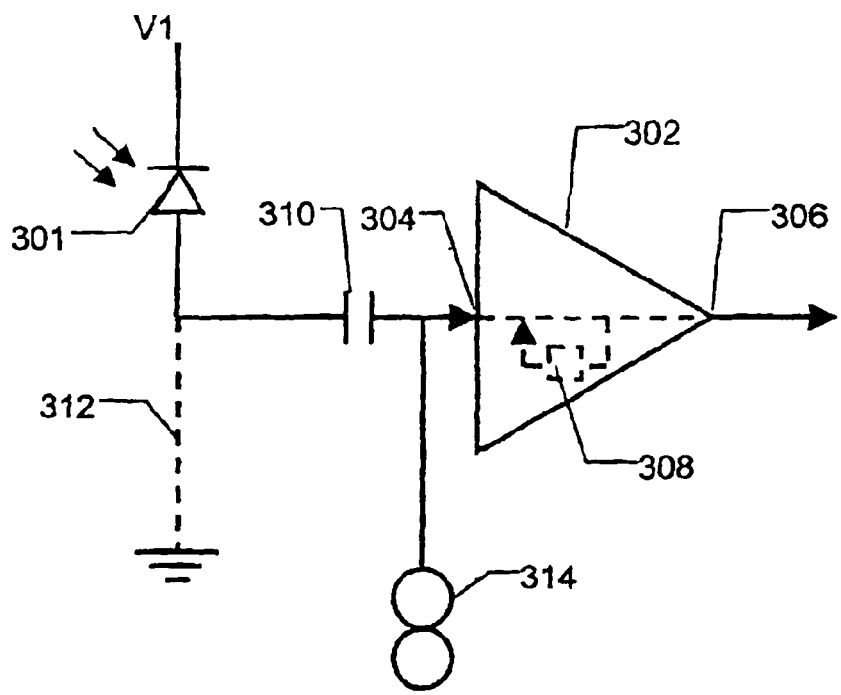
FIG. 2 shows schematically a simple embodiment of the present invention.

FIG. 2 shows an amplifier circuit according to the invention. The amplifier circuit comprises a light sensitive member 301, for example a photo-diode. In the shown example, the cathode of the photo-diode is connected to a bias voltage V1. The anode of the photo-diode 301 is connected to a filter unit 310, in this case a capacitor, which in its turn is connected to a first input 304 of the amplifier unit 302. The capacitor 310 prevents a direct current from the photo-diode 301 from reaching the first input 304. The hatched line 312 symbolises that such a direct current is conducted away from the photo-diode 301. The amplifier unit 302 has a first output 306 where an amplified output signal is delivered. The amplifier unit 302 is of the kind which does not have any special input intended for controlling the amplification of the amplifier unit 302. Such an amplifier unit 302 may suitably constitute a preamplifier component of the kind which has been described initially above. Such a component 302 may comprise an internal amplification controlling unit 308. Such an amplification controlling unit 308 may, but does not have to, comprise a feedback control loop.

According to the invention, a control unit 314 is connected to the first input. According to the shown example, the control unit 314 constitutes a variable current generator. With this current generator 314 the current into the first input 304 may be controlled. The current generator 314 may thus be used for influencing the amplification of the circuit.

It should be noted that the figures only show preferred embodiments. Within the scope of the invention is of course the possibility that for example the polarity of the circuit may be the opposite. With reference to FIG. 2, for example the photo-diode 301 could be reversed and V1 could be a negative voltage. The control unit 314 would in this case control a current out from the first input 304.

Figure 3:
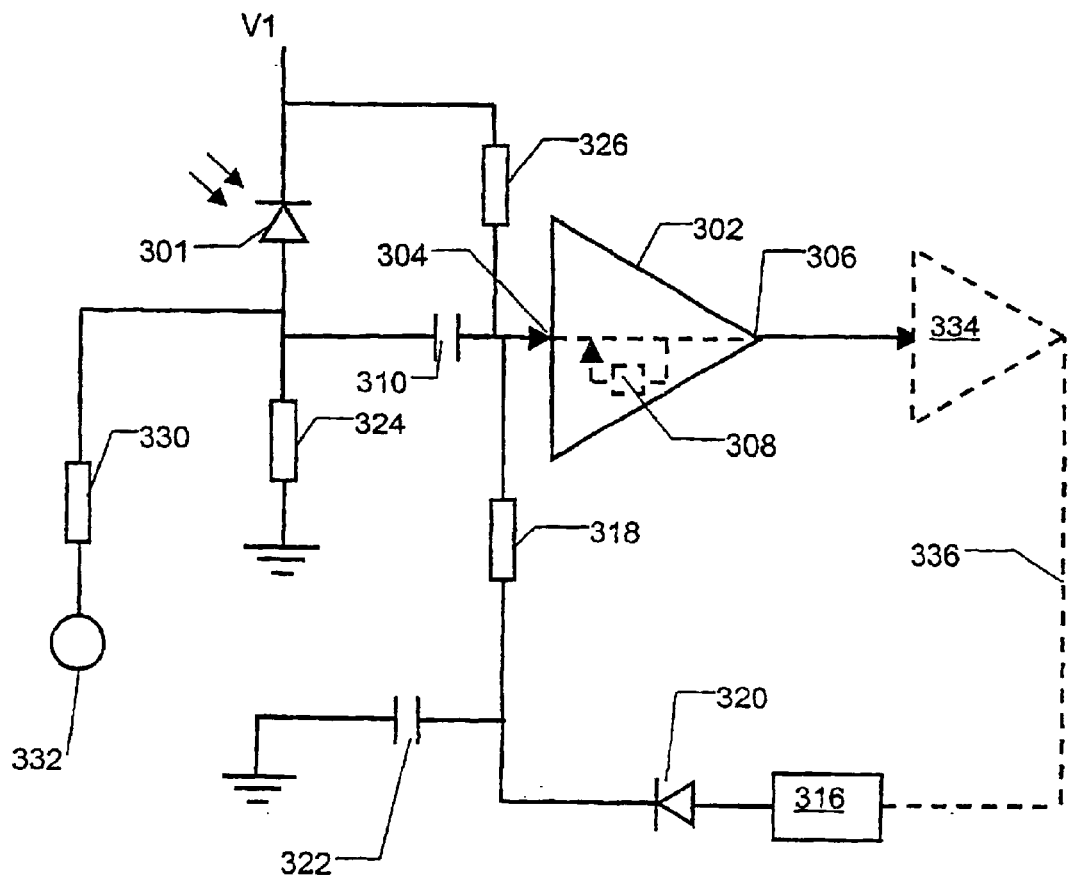
FIG. 3 shows another embodiment of the present invention.

FIG. 3 shows a further embodiment of the invention. The corresponding parts as in FIG. 2 have the same reference signs as in FIG. 2. These parts will therefore not be described more closely in connection with FIG. 3. According to FIG. 3, the control unit constitutes a variable amplification-controlling voltage unit 316 connected to a first resistance 318 which in its turn is connected to the first input 304. A second diode unit 320 is arranged for preventing an incorrect current direction, i.e. in this case a current out from the first input 304. A filter member 322, in this case a capacitor, is arranged to filter out possible disturbances which are superposed on the amplification-controlling voltage.

A second resistance 324 is connected to the anode of the photodiode 301 for conducting away a direct current. According to the shown embodiment, the amplifier unit 302 is of the kind where a low current into the first input 304 means a high amplification. In order to ensure that a certain current is always present at the first input 304, a third resistance 326 is arranged between the bias voltage V1 and the first input 304. This third resistance 326 thus limits the amplification of the circuit.

As has been mentioned above, it may be interesting to measure the photo current through the photo-diode 301. The photo current is proportional to the voltage over the second resistance 324. However, it may be unsuitable to measure this voltage since such a measurement could lead to disturbances in a sensitive part of the circuit. In order to avoid this problem, a fourth resistance 330 is connected to the anode of the photo-diode 301. This fourth resistance is suitably a resistance with a high resistance. A measurement device 332 may thus be connected to this fourth resistance 330.

334 symbolises a circuit which follows after the amplifier unit 302. This circuit 334 may comprise an amplifier. The hatched line 336 symbolises that a feedback from this circuit 334 may be arranged for influencing the variable voltage which is symbolised by the unit 316.

Figure 4:
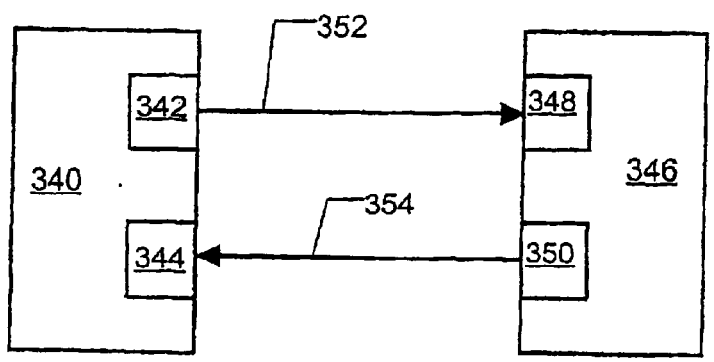
FIG. 4 shows schematically an optical communication system according to the invention.

FIG. 4 shows schematically an optical communication system according to the invention. Such a communication system comprises a first transmitter-receiver unit 340. This unit comprises a transmitter 342 and a receiver 344. A second transmitter-receiver unit is designated by 346. This second transmitter-receiver unit 346 comprises a receiver 348 and a transmitter 350. The communication system comprises a first 352 and a second 354 optical fibre. According to the invention, at least one of said transmitter-receiver units 340, 346 comprises an amplifier circuit according to the invention. Suitably both transmitter-receiver units 340, 346 comprises such an amplifier circuit.

The invention also concerns a method of controlling the amplification in an optical input stage of the kind which has been described above, i.e. an amplifier circuit which comprises a light sensitive member 301 arranged to receive an optical input signal and to deliver an electric signal in response to the received optical signal, and an amplifier unit 302 with a first input 304 arranged to receive the electric signal from the light sensitive member 301, wherein the amplifier unit 302 is arranged to influence the amplification of the electric signal and to deliver an amplified output signal. The amplifier unit 302 is of the kind which does not have any further input specially intended for controlling the amplification of the amplifier unit. According to the method, a filter unit 310 is arranged for preventing a possible direct current in an electric signal from the light sensitive member 301 from reaching the first input 304 of the amplifier unit 302. Furthermore, a control unit 314 is connected to the first input 304 for controlling the power of the electric signal at this first input 304. Thereby the amplification of the input stage is influenced.

Advantageous embodiments of the method are clear from the claims 15 and 16. Further advantageous embodiments of the method are clear from the above-described function of the amplifier circuit.

The invention is not limited to the described embodiments but may be varied and modified within the scope of the following claims.

What is claim is:

1. An amplifier circuit for receiving an optical signal, which amplifier circuit comprises:
 a light sensitive member arranged to receive an optical input signal and to deliver an electric signal in response to the received optical signal,
 an amplifier unit with a first input arranged to receive the electric signal from the light sensitive member, wherein the amplifier unit is arranged to influence the amplification of the electric signal and to deliver an amplified output signal via a first output, wherein the amplifier unit does not have any further input specially intended for controlling the amplification of the amplifier unit, characterised by
 a filter unit arranged to prevent a possible direct current in the electric signal from the light sensitive member from reaching said first input, wherein said light sensitive member is arranged such that a possible direct current from the light sensitive member would be directed into said amplifier unit via the first input if said filter unit were not arranged to prevent such a direct current, an
 a control unit connected to said first input and arranged to control the power of an electric current in a direction in via the first input for thereby influencing the power of said output signal.

2. An amplifier circuit according to claim 1, wherein the control unit is arranged as a controllable current generator in that a variable amplification-controlling voltage unit is connected to a first resistance connected to said first input.

3. An amplifier circuit according to claim 1, wherein said light sensitive member comprises a first diode unit with a first connection connected to a bias voltage and a second connection connected to said filter unit, which filter unit is connected to the first input.

4. An amplifier circuit according to claim 3, wherein the first connection constitutes the cathode side of the first diode unit and the second connection constitutes the anode side of the first diode unit.

5. An amplifier circuit according to claim 3, comprising a second resistance connected to said second connection for conducting away a possible direct current through the first diode unit.

6. An amplifier circuit according to claim 1, comprising an amplification limiting unit connected to said first input.

7. An amplifier circuit according to claim 6, wherein the amplification limiting unit comprises a third resistance connected between a voltage source and said first input.

8. An amplifier circuit according to claim 1, wherein said amplifier unit comprises an internal amplification controlling unit, for example arranged for reducing the amplification at too high currents.

9. An amplifier circuit according to claim 1, comprising a second diode unit connected to said control unit for preventing incorrect current direction to/from the first input.

10. An amplifier circuit according to claim 1, comprising a filter member connected to said control unit for filtering out possible disturbances of the electric signal which is controlled with the control unit.

11. An amplifier circuit according to claim 1, comprising a fourth resistance with a first side connected to said light sensitive member and a second side arranged to be connectable to a measuring unit for measuring the current through the light sensitive member.

12. An optical communication system comprising a first transmitter-receiver unit, a second transmitter-receiver unit and at least one optical conduction member which connects the first and the second transmitter-receiver units, wherein at least one of said transmitter-receiver units comprises an amplifier circuit according to claim 1.

13. A method for controlling the amplification in an optical input stage which comprises a light sensitive member arranged to receive an optical input signal and to deliver an electric signal in response to the received optical signal, an amplifier unit with a first input arranged to receive the electric signal from the light sensitive member, wherein the amplifier unit is arranged to influence the amplification of the electric signal and to deliver an amplified output signal via a first output , wherein the amplifier unit does not have any further input specially intended for controlling the amplification of the amplifier unit , which method comprises the following steps:

that a filter unit is arranged to prevent a possible direct current in the electric signal from the light sensitive member from reaching said first input, wherein said light sensitive member is arranged such that a possible direct current from the light sensitive member would be directed into said amplifier unit via the first input if said filter unit were not arranged to prevent such a direct current, and that a control unit is connected to said first input and arranged to control the power of an electric current in a direction in via the first input for thereby influencing the power of said output signal.

14. A method according to claim 13, wherein the control unit is arranged as a controllable current generator in that a variable amplification controlling voltage is applied over a first resistance connected to said first input.

15. A method according to claim 14, wherein said light sensitive member (301) is arranged such that a possible direct current from the light sensitive member (301) would be directed into said amplifier unit (302) via the first input (304) if said filter unit (310) were not arranged to prevent such a direct current, wherein the control unit (314) is arranged to control the power of an electric current in a direction in via the first input (304).

16. A method according to claim 14 or 15, wherein the control unit (314) is arranged as a controllable current generator in that a variable amplification controlling voltage (316) is applied over a first resistance (318) connected to said first input (304).

\* \* \* \* \*